(12) United States Patent
Shen et al.

(10) Patent No.: US 11,283,215 B2
(45) Date of Patent: Mar. 22, 2022

(54) MAGNETIC CONNECTOR SYSTEM AND METHOD OF USING

(71) Applicant: Xerox Corporation, Norwalk, CT (US)

(72) Inventors: Ethan Shen, Toronto (CA); Yuije Zhu, Mississauga (CA); Tianxiao Xu, Oakville (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 16/927,134

(22) Filed: Jul. 13, 2020

(65) Prior Publication Data

US 2022/0013955 A1 Jan. 13, 2022

(51) Int. Cl.
*H01R 11/30* (2006.01)
*H01R 13/62* (2006.01)
*H01R 13/639* (2006.01)
*H01R 13/24* (2006.01)

(52) U.S. Cl.
CPC ..... *H01R 13/6205* (2013.01); *H01R 13/2421* (2013.01); *H01R 13/639* (2013.01); *H01R 2201/06* (2013.01); *H01R 2201/18* (2013.01)

(58) Field of Classification Search
CPC ............ H01R 13/6205; H01R 13/2421; H01R 13/329
USPC .................................................... 439/39, 700
See application file for complete search history.

(56) References Cited

U.S. PATENT DOCUMENTS

| 5,366,380 | A | * | 11/1994 | Reymond | ............... | H01L 24/72 |
| | | | | | | 257/E23.078 |
| 5,425,649 | A | * | 6/1995 | Reymond | ............... | H01L 24/72 |
| | | | | | | 257/E23.078 |
| 7,351,066 | B2 | | 4/2008 | DiFonzo et al. | | |
| 7,378,834 | B2 | * | 5/2008 | Hofmeister | ............ | H01R 11/30 |
| | | | | | | 324/756.05 |
| 8,138,717 | B2 | | 3/2012 | Chatterjee et al. | | |
| 8,187,006 | B2 | * | 5/2012 | Rudisill | ................. | H01R 11/30 |
| | | | | | | 439/39 |
| 8,596,881 | B2 | * | 12/2013 | Umeno | ................ | G02B 6/3897 |
| | | | | | | 385/75 |
| 8,608,502 | B2 | * | 12/2013 | Witter | ....................... | F16B 1/00 |
| | | | | | | 439/335 |
| 8,632,346 | B2 | * | 1/2014 | Wittig | ................... | H01R 4/184 |
| | | | | | | 439/82 |
| 9,088,097 | B2 | * | 7/2015 | Kim | ....................... | H01R 24/38 |
| 9,300,081 | B2 | * | 3/2016 | Rudisill | ............. | H01R 13/6205 |
| 9,318,824 | B2 | * | 4/2016 | Hara | .................... | H01R 12/714 |
| 9,640,921 | B2 | * | 5/2017 | Choi | ..................... | H01R 13/70 |

* cited by examiner

*Primary Examiner* — Neil Abrams
(74) *Attorney, Agent, or Firm* — Hoffman Warnick LLC (57) ABSTRACT

A system and method for coupling is described. The system includes, a printed electronic circuit having one or more conductive traces disposed on a flexible substrate The printed electronic circuit includes one or more magnetic couplers disposed on the flexible substrate. The system includes a magnetic connector having one or more magnets that each magnetically attach to a corresponding one of the one or more magnetic couplers The magnetic connector includes one or more spring-loaded pins each aligned with and electrically coupled to a corresponding one of the one or more conductive traces.

20 Claims, 6 Drawing Sheets

MAGNETIC CONNECTOR SYSTEM AND METHOD OF USING

BACKGROUND

Field of Use

The present disclosure relates, in various embodiments, to a magnetic connector system and method of using the magnetic connector system.

Background

Hybrid printed electronics take advantage of both printed and traditional electronics to enable fabrication of low cost, flexible, and large area circuits on plastic and paper substrates. It offers an attractive approach for creating electronically functional components for applications in smart packaging, wearable electronics, and automotive and aerospace solutions. Conventional printed circuit boards (PCBs) are currently the standard for making complex electronic circuitry. Printed electronic circuits (PECs), including flexible PECs, are commonly used for complex form factor or thin/thick film based circuitry. The two technologies have different advantages and disadvantages in characteristics, cost, manufacturing, form factor, etc. They can complement each other when used together in the system design. However, creating a bridge between the two that is easy to implement and to use is still missing.

Existing solutions include flexible printed circuit (FPC) connectors. The FPC connectors may be soldered on the PCB and finger pads are printed on the PEC side. To establish connection between the PCB and the PEC, finger pads are printed on the PEC side such that when the PEC is inserted into the PCB, the finger pads of PEC would make physical contact with internal pins of the FPC connectors of PCB.

Crimp connectors that may be pierced through and fixed onto the PEC and conventional male/female pin connector can be attached on the other end of the crimp connectors.

It would be desirable to have connectors that are easy to implement for flexible PECs.

SUMMARY

According to various embodiments, there is described a system for coupling. The system includes, a printed electronic circuit having one or more conductive traces disposed on a flexible substrate The printed electronic circuit includes one or more magnetic couplers disposed on the flexible substrate. The system includes a magnetic connector having one or more magnets that each magnetically attach to a corresponding one of the one or more magnetic couplers The magnetic connector includes one or more spring-loaded pins each aligned with and electrically coupled to a corresponding one of the one or more conductive traces.

A further aspect described herein is method for coupling. The method includes providing a printed electronic circuit having one or more conductive traces disposed on a flexible substrate. The printed electronic circuit has one or more magnetic couplers on the flexible substrate. The method includes magnetically attaching a connector to the flexible substrate. The connector includes one or more magnets that each magnetically attach to a corresponding one of the one or more magnetic couplers. The connector includes one or more spring-loaded pins at each aligned with and electrically coupled to a corresponding one of the one or more conductive traces.

A further aspect described herein is a system for coupling. The system includes a printed electronic circuit having one or more conductive traces disposed on a flexible substrate. The printed electronic circuit has one or more magnetic couplers disposed on the flexible substrate. The printed electronic circuit includes a component selected from the group consisting of wires, insulators, resistors, capacitors, inductors, transformers, transistors, antennas, printed battery, light emitting diodes, organic light emitting diodes (OLEDs) and sensors electrically coupled with the one or more conductive trace. The system includes a magnetic connector having one or more magnets that each magnetically attach to a corresponding one of the one or more magnetic couplers. The magnetic connector has one or more spring-loaded pins each aligned with and electrically coupled to a corresponding one of the one or more conductive traces. The system includes a cable electrically coupled to the one or more spring-loaded pins of the magnetic connector.

BRIEF DESCRIPTION OF THE DRAWINGS

The accompanying drawings, which are incorporated in and constitute a part of this specification, illustrate several embodiments of the present teachings and together with the description, serve to explain the principles of the present teachings.

It should be noted that some details of the FIGS. have been simplified and are drawn to facilitate understanding of the embodiments rather than to maintain strict structural accuracy, detail, and scale.

DESCRIPTION OF THE EMBODIMENTS

In the following description, embodiments are described in sufficient detail to enable those skilled in the art to practice the present teachings and it is to be understood that other embodiments may be utilized and that changes may be made without departing from the scope of the present teachings. The following description is, therefore, merely exemplary and non-limiting.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

Although embodiments of the disclosure herein are not limited in this regard, the terms "plurality" and "a plurality" as used herein may include, for example, "multiple" or "two or more." The terms "plurality" or "a plurality" may be used throughout the specification to describe two or more components, devices, elements, units, parameters, or the like. For example, "a plurality of resistors" may include two or more resistors.

Hybrid printed electronics take advantage of both printed and traditional electronics to enable fabrication of low cost, flexible, and large area circuits on plastic and paper substrates. Hybrid printed electronics offer an attractive approach for creating electronically functional components for applications in smart packaging, wearable electronics, and automotive and aerospace solutions. Conventional PCBs are currently the standard for making complex electronic circuitry and the PEC is more commonly used for complex form factor or thin/thick film based circuitry. The two technologies have different advantages and disadvantages in characteristics, cost, manufacturing, form factor. However, creating a bridge between the two that is easy to implement and to use is still missing.

The conventional way to create electrical connections on a PCB is through soldering. PECs may be printed on a polymer substrate using low temperature solder, for example, a solder which has a melting point around 150° C. Certain flexible substrates have a lower melting point or decomposition temperature of around 80-120° C. Therefore, it is not practical to connect the certain flexible substrates having conductive traces using a soldering method.

Figure 1:
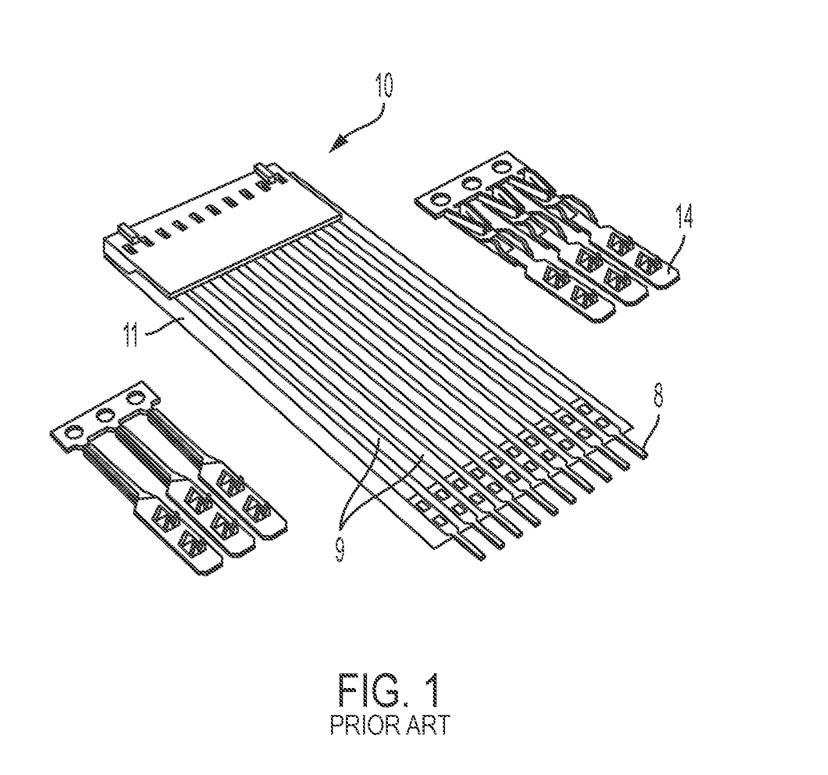
FIG. 1 shows a prior art connection between a PEC and a PCB.

In FIG. 1, a PEC 10 having a substrate 11 with conductive traces 9 disposed thereon in shown. Finger pads 8 may be coupled with the conductive traces 9. The figure pads 8 may be inserted into connector 14 and soldered so that the finger pads 8 and connector 14 are electrically coupled.

Figure 2:
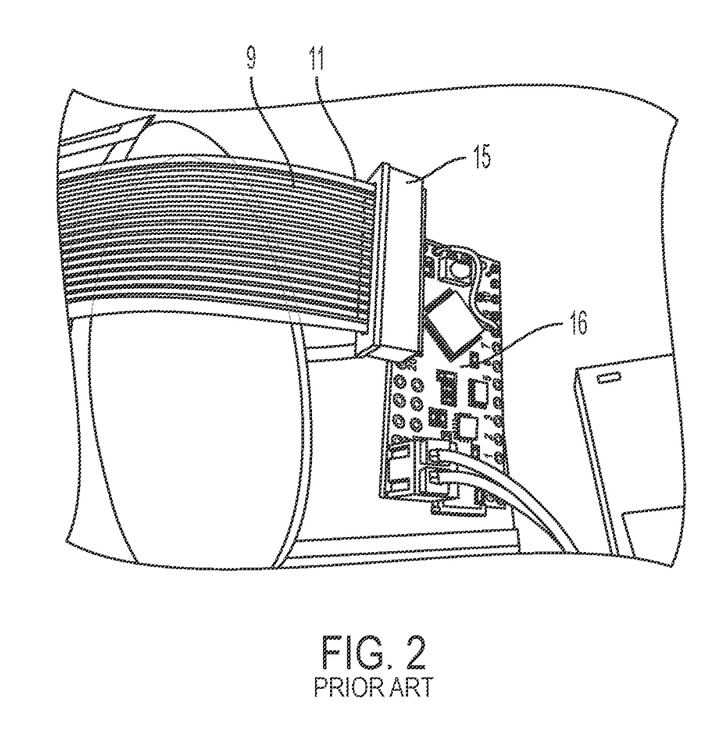
FIG. 2 shows an alternate embodiment for a prior art connection between a PEC and a PCB.

In an alternate embodiment shown in FIG. 2, the substrate 11 with conductive traces 9 and finger pads (not shown) disposed thereon is coupled with a conventional male/female pin connector 15 that may be attached to the PCB 16. The finger pads in FIG. 2 are inserted in the male/female pin connector 15 to provide electrical coupling.

Described herein is a method to create an electrical connection between conventional printed circuit board (PCB) and flexible printed electronics circuits (PECs). On the PCB side, certain number (customizable) of spring-loaded pins and two magnets (different polarity) are enclosed in a connector housing. On the PEC side, a matching number of printed conductive traces on the flexible substrate include one or more magnets (different polarity) attached on sides of the conductive traces. The spring-loaded pins move within the magnetic field of the magnets on the substrate and force pulls the connector down to form a connection. This self-alignment and self-mating property provide several advantages in certain hybrid printed electronics applications.

Described herein is system that electrically connects a conventional printed circuit board (PCB) and a flexible printed electronics circuit (PEC). The system includes a magnetic connector having a certain number (customizable) of spring-loaded pins and two magnets (different polarity) enclosed in a connector housing. The flexible PEC includes a matching number of conductive traces printed on the flexible substrate with one or more magnets (different polarity) attached on either side of the conductive traces. The spring-loaded pins of the magnetic connector move within the magnetic field of the magnets on the substrate, the magnetic force pulls the spring-loaded pins towards the conductive traces to form an electrical connection between the pins and the conductive traces. This self-alignment and self-mating property provide several advantages in certain hybrid printed electronics applications.

By incorporating magnets in a connector for securing and locking to a flexible PEC many applications such as cable or for charging or USB data can be easily implemented in hybrid circuits. Magnetic force is sufficient to secure the magnetic connector onto surface of the flexible PEC. Magnetic polarity adds self-mating feature to the connector and it is relatively easy to attach to the flexible substrate of the flexible PEC, making it suitable for bridging PCB and a flexible PEC. Described herein is an approach of fabricating and implementing magnetic connectors to bridge printed electronic traces and traditional wiring on flexible substrates. By coupling the two magnetic sides of the magnetic connector, effective and robust connections may be achieved.

Figure 3:
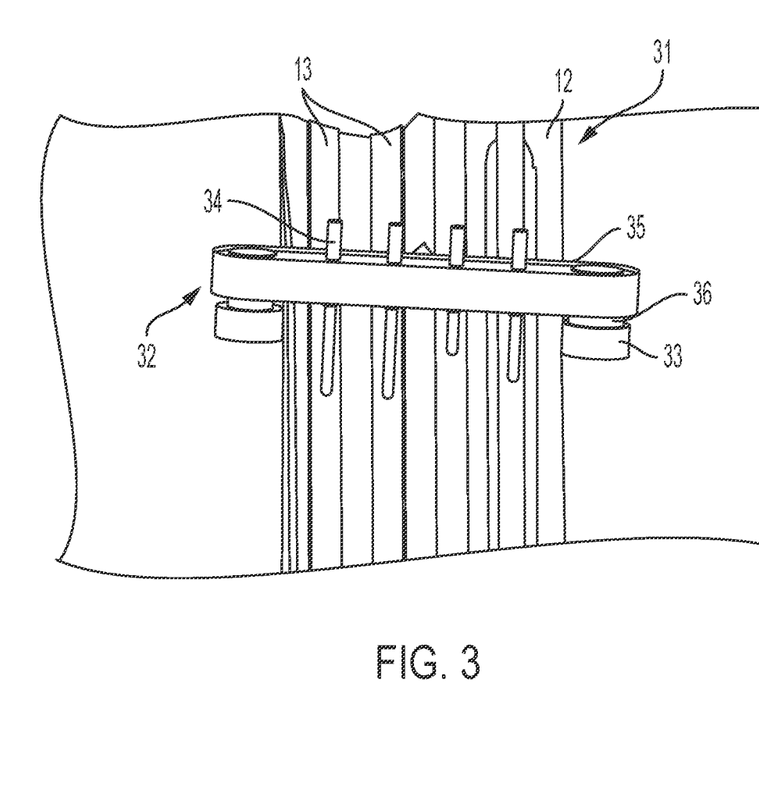
FIG. 3 show an embodiment of the present disclosure.

FIG. 3 is an illustration of the system described herein. A magnetic connector 32 including spring-loaded pins 34 in a housing 35 is shown. The magnetic connector 32 includes magnets 36 within the housing 35 on either side of the spring-loaded pins 34. The system includes a flexible PEC 31 having a flexible substrate 12 with printed conductive traces 13 disposed thereon. The flexible PEC 31 includes magnetic couplers 33 on either side of the conductive traces 13. The magnetic couplers 33 may be attached to the flexible substrate 12 or to another substrate having the flexible PEC 31 disposed thereon. The magnetic couplers 33 may be any shape that allows coupling with the magnets 36 of the magnetic connector 32. In embodiments, the magnetic couplers 33 may be plate shaped.

In operation, the spring-loaded pins 34 align with the conductive traces 12. The magnets 36 of the magnetic connector 32 on either side of the spring-loaded pins 34 align with the magnetic couplers 33. The magnets 36 of the magnetic connector 32 attach to the magnetic couplers 33 and the spring-loaded pins 34 electrically couple through contact with the printed conductive traces 13. The spring-loaded pins 34 are wired and connected to the traditional electronic components such as microcontrollers and power. The flexible PEC 31 is electrically coupled to a functional element, including but not limited to sensors, LEDs etc. As show in in FIG. 3, the spring-loaded pin 34 of magnetic connector 32 can conform to uneven surface on which the conductive traces 13 are disposed. The spring-loaded pins 34 can be held in the magnetic connector 32 so the they are offset in the up and down direction (z-direction) when making contact with the conductive traces. In embodiments, the spring-loaded pins 34 may be adjustably spaced in the magnetic connector 32, allowing for adjustment in the x-direction when making contact with the conductive traces 13. In embodiments, the spring-loaded pins 34 may be adjustably offset from each other in the magnetic connector 32, rather than in a line. This allows for adjustment in the y-direction.

Figure 4A:
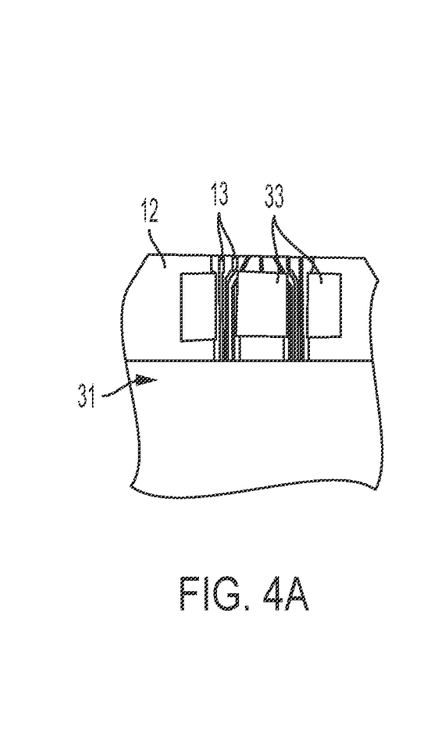
FIGS. 4(A), 4(B) and 4(C) show the process steps for employing an embodiment of the present disclosure.
Figure 4B:
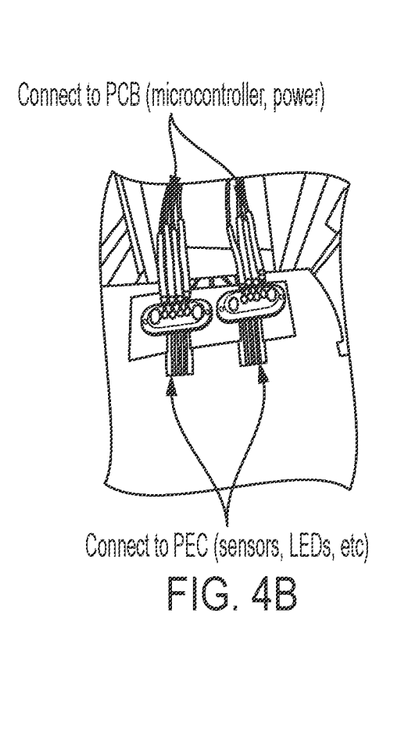

The process is illustrated in FIGS. 4(A)-3(B). The process is accomplished by printing conductive traces 13 (analog or digital) onto a flexible substrate 12 as shown in FIG. 4(A). Flexible substrates 12 include plastic, tape, textile, rubber, paper, cardboard and combinations thereof. Magnetic couplers 33 can be machined and fixed onto the designated location with adhesives, leaving the conductive traces 13 exposed. The flexible substrate 12 may be attached to another substrate (not shown). The magnetic couplers 33 may be attached to the flexible substrate 12 or to another substrate (not shown).

Figure 4C:
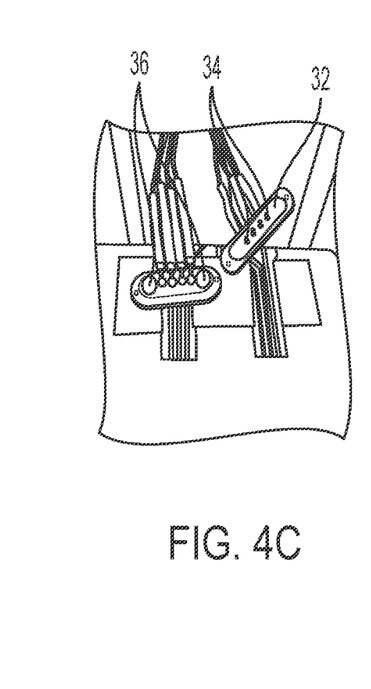

The magnetic connector 32 including spring-loaded pins 34 align with the conductive traces 13 as shown in FIG. 4(C). The magnetic conductor 32 incudes magnets 36 on either side of the spring-loaded pins 34 that align with the magnetic couplers 33 shown in FIG. 4(A). The magnets 36 of the magnetic connector 32 attach to the magnetic couplers 33 and the spring-loaded pins 34 accurately align with the printed conductive traces 13 as shown in FIG. 4(B). The spring-loaded pins 34 are wired connecting to the hardware such as microcontrollers or a power supply. The flexible PEC shown in FIG. 4(B) is electrically couples to functional elements such as sensors, electrical components for illumination, heating and sound generation including LEDs etc. Pressure sensitive adhesive films may be used as the flexible substrate 12. This can provide an attractive approach for smart point-of purchase (POP) display design and fabrication. The utilization of pressure sensitive adhesive films is an easy and versatile way to integrate modular electronic components onto POP displays. In embodiments, the pressure sensitive adhesive film is compatible with roll-to-roll printing for both conductive inks and traditional graphic inks. Conductive trace patterns may be designed using computer software and deposited onto the pressure sensitive adhesive film through digital or analog printing techniques. As the pressure sensitive adhesive film can stick to numerous types of substrates, it overcomes the limitation of poor ink adhesion and low melt temperature plastics. Connecting a microchip or other modular electronic component to the printed conductive traces on the flexible substrate allows for the incorporation of functionality such as LED indicators, digital price tags, temperature sensors, etc.

In embodiments, a fabrication process of printing conductive traces on flexible substrates such as pressure sensitive adhesive film entails printing conductive ink on the pressure sensitive adhesive film. Through digital printing methods, flexible PECs can be created in a quick manner, while the mass production techniques such as roll-to-roll printing enable the low-cost manufacturing of functional pressure sensitive adhesive films in large quantities.

The flexible PEC can be electrically coupled to antennas, sensors that measure the current between the couplers in response to changes such as temperature or humidity (the resistance of the sensing material changes causing the current to change). In embodiments, the flexible PEC can be electrically coupled to functional elements including wires, insulators, resistors, capacitors, inductors, transformers, transistors, antennas, printed battery, light emitting diodes, organic light emitting diodes (OLEDs), sensors or a combination thereof.

The spring-loaded pin 34 may be pogo pins. The spring-loaded pin 34 may have a structure that is capable being depressed into the housing 35 (FIG. 3) when it is pressed. The spring-loaded pin 34 may be a state in which it protrudes from the housing 35. As illustrated in FIG. 3, after the spring-loaded pin 34 are placed in the housing 35, a protruding length of the spring-loaded pin 34 may be visible.

The magnetic connector 32 of the system disclosed herein can be electrically couples to a printed circuit board (PCB) that includes a microcontroller or a power supply.

This approach is advantageous in its adaptability to irregular device shapes. In embodiment, the magnetic couplers 33 may be flat. Magnetic connectors 32 can be used anywhere on the substrate, even in the middle of a large substrate. The prior art connectors as shown in FIGS. 1 and 2 require an open-end or edge as the connecting area, which limits the circuit design flexibly and applications.

Figure 5:
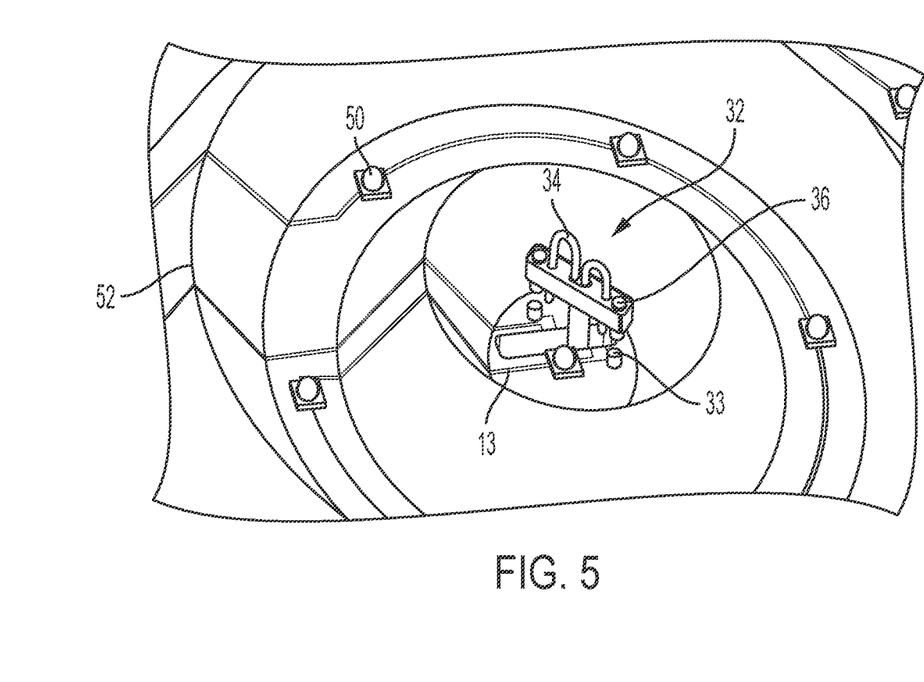
FIG. 5 show an embodiment of the present disclosure.

An embodiment of the disclosure is shown in FIG. 5. In this embodiment, the conductive trace 13 runs through a depression of the supporting substrate 52. An electronic device 50 such as a display light is electrically coupled with the conductive trace 13. A magnetic connector 32 having spring-loaded pins 34 is shown. The spring-loaded pins 34 electrically couple with the conductive trace 13. The magnetic connector 32 is held in place by magnets 36 on the magnetic connector 32 and the magnetic couplers 33 disposed on the supporting substrate 52. The magnetic connector 32 may be connected to a power supply or a microcontroller.

Figure 6:
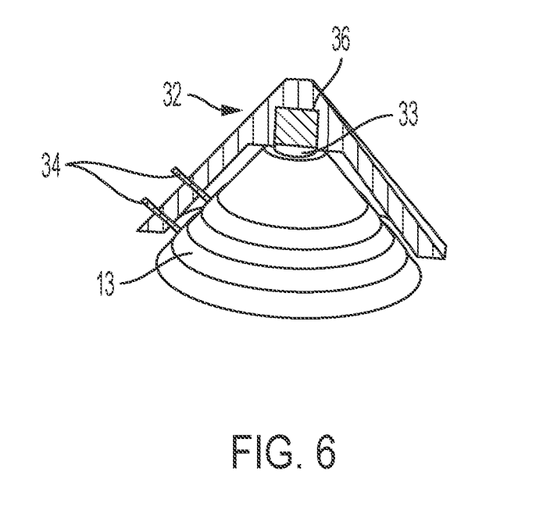
FIG. 6 show an embodiment of the present disclosure.

An embodiment of the disclosure is shown in FIG. 6. In this embodiment, the conductive traces 13 are disposed on a cone that can be rotated. A magnetic connector 32 having spring-loaded pins 34 is shown. The spring-loaded pins 34 electrically couple with the conductive traces 13. The magnetic connector 32 is held in place by magnetic interaction between magnet 36 on the magnetic connector 32 and magnetic coupler 33 disposed on the cone. The magnetic connector 32 may be connected to a power supply or microcontroller. As shown in FIGS. 5 and 6 the shape of the surface for using the system described herein can almost anything. In embodiments, the shape can be cone shaped.

Contact resistance is an important factor to evaluate the interconnect quality, where metallic surface properties and contacting pressure both play a role. In embodiments, the contact resistance between the printed conductive traces and the spring-loaded pins is below 1.5Ω. The contact resistance remains low after connecting and disconnecting for over hundreds of times, showing great robustness of the magnetic connection system described herein. The contact resistance may be higher or lower depending on the circuitry materials and applications. For connecting to a power, the contact resistance may have a higher tolerance, and for connections with more sensitive element, the contact resistance may be lower.

By using spring-loaded pins 34, the pressure on the printed conductive traces 13 is lower than prior art connectors where the conductive traces suffer from severe scratches during assembly and disassembly. With the disclosed system and method described herein, the wear and tear at the connection is less, which can extend the lifetime and useability of the magnetic connector 32 and conductive traces 13. In embodiments, the force applied by the spring-loaded pins is between 0.25N-1N; however, the force applied can be greater or lesser depending on the application.

The magnetic connectors 32 provide as flexible form factor applicable to any device shape, which is superior to the crimper connectors that require particular ribbon form factor. Perturbations in the flatness of the flexible substrate 12 are overcome by the spring-loaded pins 34. The simplicity in fabrication and implementation of the magnetic connectors makes it a powerful tool for hybrid electronic interconnects. It is also advantageous in the ease of alignment and as the magnetic polarity provides self-mating feature when making the connection. The elimination of soldering at the connection greatly improved its compatibility with printed electronics on a wider range of flexible substrates.

Specific embodiments will now be described in detail. These examples are intended to be illustrative, and are not limited to the materials, conditions, or process parameters set forth in these embodiments. All parts are percentages by solid weight unless otherwise indicated.

EXAMPLES

The examples set forth herein are being submitted to illustrate embodiments of the present disclosure. These examples are intended to be illustrative only and are not intended to limit the scope of the present disclosure.

A functional point-of-purchase (POP) display using these magnetic interconnects was demonstrated. The POP display had conductive traces printed on a cardboard substrate using a conductive ink. A magnetic connector described herein connected to the conductive traces and was connected to a power supply and a PCB. The POP display included proximity sensors that provided information of how many users passed by the display and how long the users interact with the display. The POP display included LED displays that provided information of how many users passed by the display and how long the users interacted with the display.

The system presented in the disclosure is superior to other type of connection methods for printed electronic circuits (PECs) due to its unique feature, for example, its extremely flexible form factor applicable to many device shapes and possible connecting position.

It will be appreciated that various features of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

What is claimed is:

1. A system for coupling, comprising:
a printed electronic circuit including;
one or more conductive traces disposed on a flexible substrate; and
one or more magnetic couplers disposed on the flexible substrate; and
a magnetic connector, including;
one or more magnets that each magnetically attach to a corresponding one of the one or more magnetic couplers, wherein none of the one or more magnetic couplers or magnets contact the one or more conductive traces; and
one or more spring-loaded pins each aligned with, in contact with and electrically coupled to a corresponding one of the one or more conductive traces.

2. The system of claim 1, wherein the one or more spring-loaded pins protrude from a surface of the magnetic connector.

3. The system of claim 1, wherein a contact resistance between each of the one or more conductive traces and the corresponding one of the one or more spring-loaded pins is less than 1.5Ω.

4. The system of claim 1, wherein the magnetic connector allows the one or more spring-loaded pins to be offset from each other.

5. The system of claim 1, wherein the flexible substrate is disposed on a cone-shaped substrate.

6. The system of claim 1, wherein the printed electronic circuit is electrically coupled with a component selected from the group consisting of wires, insulators, resistors, capacitors, inductors, transformers, transistors, antennas, printed battery, light emitting diodes, organic light emitting diodes (OLEDs) and sensors.

7. The system of claim 1, wherein the one or more spring-loaded pins of the magnetic connector are electrically coupled with a cable.

8. The system of claim 1, wherein the system is part of a point of purchase (POP) display.

9. A method for coupling comprising:
providing a printed electronic circuit including;
one or more conductive traces disposed on a flexible substrate; and
one or more magnetic couplers on the flexible substrate; and
magnetically attaching a connector to the substrate, the connector including;
one or more magnets that each magnetically attach to a corresponding one of the one or more magnetic couplers, wherein none of the magnets and magnetic couplers contact the one or more conductive traces; and
one or more spring-loaded pins at each aligned with, in contact with and electrically coupled to a corresponding one of the one or more conductive traces.

10. The method of claim 9, wherein the one or more spring-loaded pins protrude from a surface of the magnetic connector.

11. The method of claim 9, wherein a contact resistance between each of the one or more conductive traces and the corresponding one of the one or more spring-loaded pins is less than 1.5Ω.

12. The method of claim 9, wherein the one or more spring-loaded pins can be adjustably attached to the connector in the x, y or z-directions.

13. The method of claim 9, wherein the flexible substrate is disposed on a cone-shaped substrate.

14. The method of claim 9, wherein the printed electronic circuit is electrically coupled with a component selected from the group consisting of wires, insulators, resistors, capacitors, inductors, transformers, transistors, antennas, printed battery, light emitting diodes, organic light emitting diodes (OLEDs) and sensors.

15. The method of claim 9, wherein the one or more spring-loaded pins of the magnetic connector is electrically coupled with a cable.

16. A system for coupling comprising:
a printed electronic circuit including;
one or more conductive traces disposed on a flexible substrate;
one or more magnetic couplers disposed on the flexible substrate; and
a component selected from the group consisting of wires, insulators, resistors, capacitors, inductors, transformers, transistors, antennas, printed battery, light emitting diodes, organic light emitting diodes (OLEDs) and sensors electrically coupled with the one or more conductive traces; and
a magnetic connector including;
one or more magnets that each magnetically attach to a corresponding one of the one or more magnetic couplers, wherein none of the magnets and magnetic couplers contact the one or more conductive traces; and one or more spring-loaded pins each aligned with, in contact with and electrically coupled to a corresponding one of the one or more conductive traces; and a multiconductor cable electrically coupled to the one or more spring-loaded pins of the magnetic connector.

17. The system of claim 16, wherein the printed electronic circuit is disposed on an uneven surface.

18. The system of claim 17, wherein the uneven surface is cone-shaped.

19. The system of claim 16, wherein the system is part of a point of purchase (POP) display.

20. The system of claim 16, wherein the one or more spring-loaded pins is adjustably attached to the connector in the x, y or z-directions.

* * * * *